(12) United States Patent
Endo et al.

(10) Patent No.: US 7,314,703 B2
(45) Date of Patent: Jan. 1, 2008

(54) CHEMICALLY AMPLIFIED RESIST MATERIAL AND PATTERN FORMATION METHOD USING THE SAME

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/409,207

(22) Filed: Apr. 24, 2006

(65) Prior Publication Data

US 2006/0281025 A1 Dec. 14, 2006

(30) Foreign Application Priority Data

Jun. 14, 2005 (JP) ............................. 2005-174256

(51) Int. Cl.
  *G03C 1/492* (2006.01)
  *G03C 1/494* (2006.01)
  *G03C 1/76* (2006.01)

(52) U.S. Cl. .................................... 430/270.1; 430/905

(58) Field of Classification Search ............. 430/270.1, 430/905
  See application file for complete search history.

(56) References Cited

U.S. PATENT DOCUMENTS 6,303,263 B1 * 10/2001 Chen et al. ............... 430/270.1
6,902,859 B2 * 6/2005 Yamamoto et al. ....... 430/270.1
2003/0127048 A1 7/2003 Kokubo et al.
2005/0026070 A1 2/2005 Lee et al.

OTHER PUBLICATIONS

M. Switkes and M. Rothschild, "Immersion lithography at 157 nm", J. Vac. Sci. Technol., vol. B19, p. 2353 (2001).
B. W. Smith, A. Bourov, Y. Fan, L. Zavyalova, N. Lafferty, F. Cropanese, "Approaching the numerical aperture of water—Immersion Lithography at 193 nm", Proc. SPIE, vol. 5377, p. 273 (2004).
R. Dammel. et al. "193 nm Immersion Lithography—Taking the Plunge". Journal of Photopolymer Science and Technology, 2004, p. 587-602, vol. 17, No. 4. Chiba, JP.
W. Hinsberg et al. "Liquid Immersion Lithography—Evaluation of Resist Issues". Proceedings of SPIE—The International Society for Optical Engineering, p. 21-31, vol. 5376, No. 1 USA, 2004.
Partial European Search Report in corresponding European Patent Application No. EP 06006301.3-1226, dated Nov. 17, 2006.

* cited by examiner

*Primary Examiner*—Geraldina Visconti
(74) *Attorney, Agent, or Firm*—McDermott Will & Emery LLP

(57) ABSTRACT

In a pattern formation method, a resist film made of a chemically amplified resist material including a first polymer having hemiacetal or hemiketal is formed on a substrate. Then, with a liquid provided on the resist film, pattern exposure is performed by selectively irradiating the resist film with exposing light. After the pattern exposure, the resist film is developed so as to form a resist pattern made of the resist film.

42 Claims, 13 Drawing Sheets

CHEMICALLY AMPLIFIED RESIST MATERIAL AND PATTERN FORMATION METHOD USING THE SAME

CROSS-REFERENCE TO RELATED APLICATIONS

This application claims priority under 35 U.S.C. §119 on Patent Application No. 2005-174256 filed in Japan on Jun. 14, 2005, the entire contents of which are hereby incorporated by reference.

BACKGROUND OF THE INVENTION

The present invention relates to a chemically amplified resist material for use in immersion lithography and a pattern formation method using the same to be employed in fabrication process or the like for semiconductor devices.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength of 157 nm is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B19, p. 2353 (2001)).

In the immersion lithography, a region in an exposure system sandwiched between a projection lens and a resist film formed on a wafer is filled with a liquid having a refractive index n (whereas n>1) and therefore, the NA (numerical aperture) of the exposure system has a value n·NA. As a result, the resolution of the resist film can be improved.

Also, in order to increase the refractive index in the immersion lithography, use of an acidic solution as the immersion liquid has been proposed (see, for example, B. W. Smith, A. Bourov, Y. Fan, L. Zavyalova, N. Lafferty, F. Cropanese, "Approaching the numerical aperture of water—Immersion Lithography at 193 nm", Proc. SPIE, Vol. 5377, p. 273 (2004)).

Now, a pattern formation method employing the immersion lithography will be described as Conventional Example 1 with reference to FIGS. 11A through 11D.

First, a positive chemically amplified resist material having the following composition is prepared:

Base polymer: poly((norbornene-5-methylene methoxymethyl carboxylate) (50 mol %)–(maleic acid) (50 mol %)) . . . 2 g
Acid generator: triphenylsulfonium trifluoromethane sulfonate . . . 0.04 g
Quencher: triethanolamine . . . 0.002 g
Solvent: propylene glycol monomethyl ether acetate . . . 20 g Next, as shown in FIG. 11A, the aforementioned chemically amplified resist material is applied on a substrate 1 so as to form a resist film 2 with a thickness of 0.35 μm.

Then, as shown in FIG. 11B, with water 4, that is, an immersion liquid, provided on the resist film 2, pattern exposure is carried out by irradiating the resist film 2 through the water 4 with exposing light 5 of ArF excimer laser having NA of 0.68 having passed through a mask 6.

After the pattern exposure, as shown in FIG. 11C, the resist film 2 is baked with a hot plate at a temperature of 105° C. for 60 seconds, and thereafter, the resultant resist film 2 is developed with a 2.38 wt % tetramethylammonium hydroxide developer. In this manner, a resist pattern 2a made of an unexposed portion of the resist film 2 and having a line width of 0.09 μm is formed as shown in FIG. 11D.

Furthermore, a pattern formation method employing the immersion lithography performed with a barrier film provided on a resist film will be described as Conventional Example 2 with reference to FIGS. 12A through 12D, 13A and 13B.

First, a positive chemically amplified resist material having the following composition is prepared:

| | |
|---|---|
| Base polymer: poly((norbornene-5-methylene methoxymethyl carboxylate) (50 mol %) - (maleic anhydride) (50 mol %)) | 2 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Next, as shown in FIG. 12A, the aforementioned chemically amplified resist material is applied on a substrate 11 so as to form a resist film 12 with a thickness of 0.35 μm.

Then, as shown in FIG. 12B, by using a barrier film material having the following composition, a barrier film 13 having a thickness of 0.03 μm is formed on the resist film 12 by, for example, spin coating:

| | |
|---|---|
| Base polymer: polyvinyl hexafluoroisopropyl alcohol | 1 g |
| Solvent: n-butyl alcohol | 20 g |

Next, as shown in FIG. 12C, the resultant barrier film 13 is baked with a hot plate at a temperature of 120° C. for 90 seconds.

Then, as shown in FIG. 12D, with water 14, that is, an immersion liquid, provided on the barrier film 13, pattern exposure is carried out by irradiating the resist film 12 through the water 14 and the barrier film 13 with exposing light 15 of ArF excimer laser having NA of 0.68 having passed through a mask 16.

After the pattern exposure, as shown in FIG. 13A, the resist film 12 is baked with a hot plate at a temperature of 105° C. for 60 seconds, and thereafter, the resultant resist film 12 is developed with a 2.38 wt % tetramethylammonium hydroxide developer. In this manner, a resist pattern 12a made of an unexposed portion of the resist film 12 and having a line width of 0.09 μm is formed as shown in FIG. 13B.

However, as shown in FIG. 11D of Conventional Example 1 and FIG. 13B of Conventional Example 2, each resist pattern 2a or 12a obtained by the conventional pattern formation method is in a defective shape.

SUMMARY OF THE INVENTION

The present inventors have variously examined the reason why the resist pattern 2a formed by the immersion lithography of Conventional Example 1 is in a defective shape, resulting in finding the following: In the immersion lithography in which the water 4 used as the immersion liquid is in direct contact with the resist film 2 as in Conventional Example 1, the surface of the resist film 2 is modified (through, for example, elution of the acid generator) due to the contact between the water 4 and the resist film 2, and hence, the solubility of an exposed portion of the resist film 2 is lowered. Furthermore, in Conventional Example 2 in which the barrier film 13 is provided on the resist film 12 for preventing this modification (performance degradation) of the resist film 2 caused by the water 2, the surface of the resist film 12 is also modified through contact between the barrier film 13 and the resist film 12, and hence, the solubility of an exposed portion of the resist film 12 is lowered.

Specifically, although an elimination reaction by an acid is generally caused in an acid labile group in the exposed portion of the resist film 2 or 12, when the surface of the resist film 2 or 12 is modified, the elimination reaction is inhibited by the modification of the resist film 2 or 12 caused by the water 4 or the barrier film 13. As a result, the solubility of the exposed portion of the resist film 2 or 12 is lowered, and hence, a surface insoluble layer is formed in the resist pattern 2a or 12a. Accordingly, the pattern is formed in a defective shape with a T-top portion. This pattern failure due to the modification is caused not only in using a positive resist material, but when a negative resist material is used, a cross-linkage reaction is not sufficiently proceeded in an exposed portion due to the modification caused by water or a barrier film and hence pattern failure also occurs.

When the resist pattern 2a or 12a in such a defective shape is used for etching a target film, the resultant pattern of the target film is also in a defective shape, which disadvantageously lowers the productivity and the yield in the fabrication process for semiconductor devices.

In consideration of the aforementioned conventional problem, an object of the invention is forming a fine pattern in a good shape through the immersion lithography.

The present inventors have found that when a chemically amplified resist material includes a polymer having a hemiacetal group or a hemiketal group, a surface insoluble layer is not formed in a resist film in development because when, for example, a positive type resist material is used, an exposed portion of the resist film is thus easily dissolved. This is because the solubility in an alkaline aqueous solution is improved owing to a hydroxyl group (OH group) present in the hemiacetal group or the hemiketal group. In other words, since the hemiacetal group or the hemiketal group has a substituent for producing an OH group through a reaction with an acid, an OH group is produced in an exposed portion of the resist film where an acid is generated while no OH group is produced in an unexposed portion. Therefore, the number of OH groups is increased due to the substituent in the exposed portion of the resist film, and since the OH group is highly reactive with an alkaline solvent, the solubility of the exposed portion is improved. Accordingly, removability of the resist film becomes higher in the exposed portion than in the unexposed portion where no OH group is produced, and hence, the contrast between the exposed portion and the unexposed portion of the resist film can be improved.

Specifically, since such a group includes an OH group, an elimination unit resulting from the elimination reaction by an acid is alcohol alone (see Formulas 1 and 2 below).

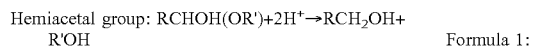

Hemiacetal group: RCHOH(OR')+2H⁺→RCH₂OH+ R'OH    Formula 1:

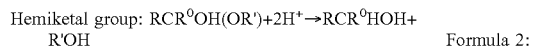

Hemiketal group: RCR⁰OH(OR')+2H⁺→RCR⁰HOH+ R'OH    Formula 2:

On the other hand, in a conventionally used acetal group or ketal group, an elimination unit resulting from the elimination reaction by an acid is aldehyde or ketone and alcohol in the presence of water, and therefore, the aldehyde or ketone inhibits the solubility in a developer so as to lower the solubility of an exposed portion (see Formulas 3 and 4 below).

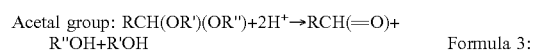

Acetal group: RCH(OR')(OR")+2H⁺→RCH(=O)+ R"OH+R'OH    Formula 3:

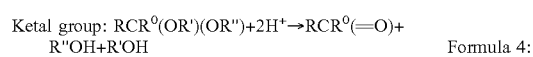

Ketal group: RCR⁰(OR')(OR")+2H⁺→RCR⁰(=O)+ R"OH+R'OH    Formula 4:

According to the present invention, which was devised on the basis of the aforementioned finding, the desired performance of a chemically amplified resist material can be kept, and the invention is specifically practiced as follows:

The chemically amplified resist material of this invention is for use in immersion lithography and includes a first polymer having hemiacetal or hemiketal.

The chemically amplified resist material of the invention includes the first polymer having hemiacetal or hemiketal, and since the hemiacetal or hemiketal has a substituent to be substituted by an OH group, the number of substituted OH groups is increased in an exposed portion of a resist film made of the resist material of the invention. Since the number of the OH groups, which are highly reactive with an alkaline solvent, is increased in the exposed portion, even when modification such as elution of an acid generator from the surface of the resist film occurs, lowering of the solubility of the exposed portion of the resist film is compensated. As a result, the contrast with an unexposed portion is improved, so that a fine pattern can be formed in a good shape.

In the chemically amplified resist material of the invention, the first polymer may include acetal or ketal.

The chemically amplified resist material of the invention may further include a second polymer having acetal or ketal.

Since the acetal or ketal has low activation energy for an elimination reaction by an acid, the contrast in the solubility between the unexposed portion and the exposed portion can be improved. In other words, when the acetal or ketal is included, the elimination reaction is proceeded with low energy so as to produce OH groups through exposure. Accordingly, the acetal or ketal works as an adjuvant for improving the solubility of the chemically amplified resist material of the invention.

The ratio of the acetal or ketal to the hemiacetal or hemiketal is lower than 50% and preferably approximately 20% or less in mol % so as not to largely spoil the solubility of the exposed portion, whereas the invention is not limited to this range.

In the chemically amplified resist material of the invention, the hemiacetal can be hydroxymethyl carboxylate or hydroxyethyl carboxylate.

In the chemically amplified resist material of the invention, the hemiketal can be hydroxyisopropyl carboxylate.

In the chemically amplified resist material of the invention, the acetal of the second polymer can be methoxymethyl carboxylate, ethoxymethyl carboxylate, methoxyethyl carboxylate, ethoxyethyl carboxylate, adamantoxymethyl carboxylate or adamantoxyethyl carboxylate.

In the chemically amplified resist material of the invention, the ketal of the second polymer can be methoxyisopropyl carboxylate, ethoxyisopropyl carboxylate or adamantoxyisopropyl carboxylate.

The first pattern formation method of this invention includes the steps of forming, on a substrate, a resist film made of a chemically amplified resist material including a first polymer having hemiacetal or hemiketal; performing pattern exposure by selectively irradiating the resist film with exposing light with a liquid provided on the resist film; and forming a resist pattern made of the resist film by developing the resist film after the pattern exposure.

In the first pattern formation method, the chemically amplified resist material used for forming the resist film includes the first polymer having hemiacetal or hemiketal, and since the hemiacetal or hemiketal has a substituent to be substituted by an OH group, the number of substituted OH groups is increased in an exposed portion of the resist film, and hence, lowering of the solubility of an exposed portion of the resist film is compensated. As a result, the contrast between the exposed portion and an unexposed portion is improved, so that the resist pattern can be formed in a good shape.

The second pattern formation method of the invention includes the steps of forming, on a substrate, a resist film made of a chemically amplified resist material including a first polymer having hemiacetal or hemiketal; forming a barrier film on the resist film; performing pattern exposure by selectively irradiating the resist film through the barrier film with exposing light with a liquid provided on the barrier film; and removing the barrier film and forming a resist pattern made of the resist film by developing the resist film after the pattern exposure.

In the second pattern formation method, the barrier film is provided on the resist film, the chemically amplified resist material used for forming the resist film includes the first polymer having hemiacetal or hemiketal, and since the hemiacetal or hemiketal has a substituent to be substituted by an OH group, the number of substituted OH groups is increased in an exposed portion of the resist film, and hence, lowering of the solubility of an exposed portion of the resist film is compensated. As a result, the contrast between the exposed portion and an unexposed portion is improved, so that the resist pattern can be formed in a good shape.

The third pattern formation method of the invention includes the steps of forming, on a substrate, a resist film made of a chemically amplified resist material including a first polymer having hemiacetal or hemiketal; forming a barrier film on the resist film; performing pattern exposure by selectively irradiating the resist film through the barrier film with exposing light with a liquid provided on the barrier film; removing the barrier film; and forming a resist pattern made of the resist film by developing the resist film having been subjected to the pattern exposure after removing the barrier film.

In the third pattern formation method, the barrier film is provided on the resist film, the chemically amplified resist material used for forming the resist film includes the first polymer having hemiacetal or hemiketal, and since the hemiacetal or hemiketal has a substituent to be substituted by an OH group, the number of substituted OH groups is increased in an exposed portion of the resist film, and hence, lowering of the solubility of an exposed portion of the resist film is compensated. As a result, the contrast between the exposed portion and an unexposed portion is improved, so that the resist pattern can be formed in a good shape.

In this manner, in the pattern formation method of this invention using a barrier film, the barrier film may be removed during or before the development, and both have their advantages as follows: When the barrier film is removed during the development of the resist film as in the second pattern formation method, the dissolution characteristic of the resist film can be advantageously controlled to be improved. In other words, when the barrier film is removed simultaneously with the development, the dissolution characteristic of the resist film can be controlled to given extent. On the other hand, when the barrier film is removed before the development as in the third pattern formation method, the following development can be smoothly performed.

Now, the dissolution characteristic of a resist film will be described with reference to FIG. 14. In general, when the dissolution characteristic of a resist film is high, the dissolution rate is abruptly increased when exposure exceeds a given threshold value (a threshold region of FIG. 14) (as shown with a graph A of a broken line in FIG. 14). As the change of the dissolution rate against the exposure is more abrupt, a difference in the solubility between an exposed portion and an unexposed portion of the resist film is larger, and hence, the resist pattern can be more easily formed in a good shape. Accordingly, in the case where the barrier film is removed during the development, the dissolution rate is wholly lowered correspondingly to the removal of the barrier film, and hence, the change in a portion surrounded with a circle C in FIG. 14 can be reduced to be flatter. As a result, in the case where the actual resist film has the dissolution characteristic as shown with a graph B, the dissolution rate attained with smaller exposure can be adjusted to be comparatively constant at a low dissolution rate even when the small exposure varies to some extent. Accordingly, a difference in the solubility between an exposed portion and an unexposed portion of the resist film can be easily caused, resulting in easily forming a resist pattern in a good shape.

In the third pattern formation method, an aqueous solution used for removing the barrier film may be an aqueous solution having hydrogen ion concentration exponent (pH) sufficient for dissolving the barrier film. For example, a developer or a diluted developer may be used. With respect to the degree of dilution of the diluted developer, the concentration is lower than that of a general developer, i.e., a 2.38 wt % tetramethylammonium hydroxide aqueous solution, and is preferably, for example, not less than 0.001% and not more than 2%, which does not limit the invention.

In any of the first through third pattern formation methods, the first polymer of the chemically amplified resist material may include acetal or ketal.

In any of the first through third pattern formation methods, the chemically amplified resist material may further include a second polymer having acetal or ketal.

Any of the first through third pattern formation methods preferably further includes, between the step of forming a barrier film and the step of performing pattern exposure, a step of subjecting the barrier film to a thermal treatment. Thus, the denseness of the barrier film is improved, so as to increase the insolubility in the liquid provided thereon in the exposure. However, when the denseness of the barrier film is increased too much, the removability of the barrier film is lowered, and therefore, it is preferably baked at a temperature in an appropriate range. For example, the temperature is preferably not less than 80° C. and not more than 130° C. and more preferably not less than 90° C. and not more than 120° C., which does not limit the invention.

In any of the first through third pattern formation methods, the liquid can be water or an acidic solution.

In this case, the acidic solution can be a cesium sulfate ($Cs_2SO_4$) aqueous solution or a phosphoric acid ($H_3PO_4$) aqueous solution.

In any of the first through third pattern formation methods, the exposing light can be KrF excimer laser, Xe₂ laser, ArF excimer laser, F₂ laser, KrAr laser or Ar₂ laser.

DETAILED DESCRIPTION OF THE INVENTION

Embodiment 1

A pattern formation method according to Embodiment 1 of the invention will now be described with reference to FIGS. 1A through 1D.

First, a positive chemically amplified resist material having the following composition is prepared:

| | |
|---|---|
| Base polymer: poly((norbornene-5-methylene hydroxymethyl carboxylate) (50 mol %) - (maleic anhydride) (50 mol %)) | 2 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Figure 1A:
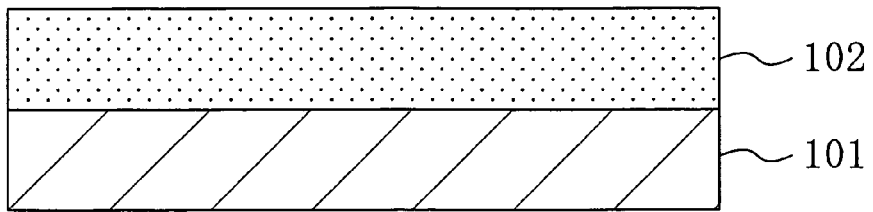
FIGS. 1A, 1B, 1C and 1D are cross-sectional views for showing procedures in a pattern formation method according to Embodiment 1 of the invention.

Next, as shown in FIG. 1A, the aforementioned chemically amplified resist material is applied on a substrate 101 so as to form a resist film 102 with a thickness of 0.35 μm.

Figure 1B:
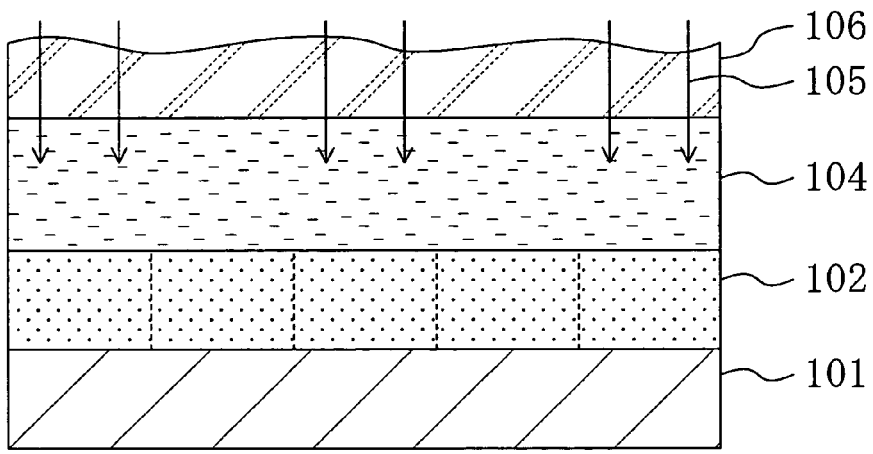

Then, as shown in FIG. 1B, with an immersion liquid 104 of water provided between the resist film 102 and a projection lens 106 by, for example, a puddle method, pattern exposure is carried out by irradiating the resist film 102 through the liquid 104 with exposing light 105 of ArF excimer laser with NA of 0.68 having passed through a mask (not shown).

Figure 1C:
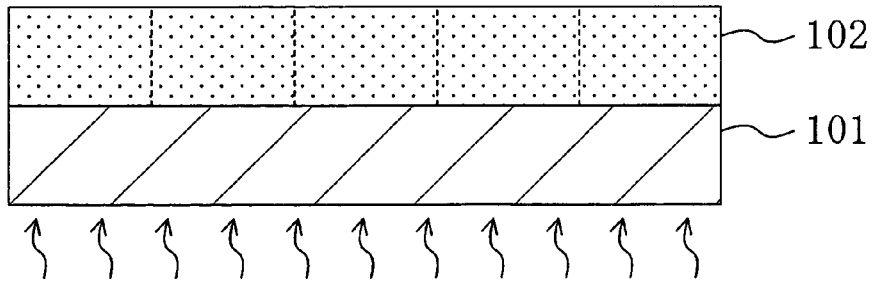

After the pattern exposure, as shown in FIG. 1C, the resist film 102 is baked with a hot plate at a temperature of 105° C. for 60 seconds (post exposure bake).

Figure 1D:
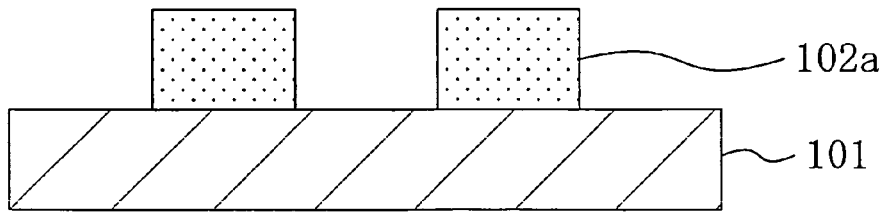

Next, the resultant resist film 102 is developed with a 2.38 wt % tetramethylammonium hydroxide developer. Thus, a resist pattern 102a made of an unexposed portion of the resist film 102 and having a line width of 0.09 μm is formed in a good shape free from a surface insoluble layer as shown in FIG. 1D.

In this manner, according to Embodiment 1, the chemically amplified resist material used for forming the resist film 102 includes the polymer having hydroxymethyl carboxylate, that is, hemiacetal. Since the hemiacetal has a substituent for producing an OH group as described above, the number of OH groups with high reactivity with the alkaline developer is increased in an exposed portion of the resist film 102. As a result, even when a portion of the resist film 102 disposed in the vicinity of the interface with the liquid 104 is modified through the contact with the liquid 104, the lowering of the solubility of the exposed portion of the resist film 102 is compensated, so as to improve the contrast between the exposed portion and the unexposed portion of the resist film 102. Accordingly, the resist pattern 102a is formed in a good shape.

Embodiment 2

A pattern formation method according to Embodiment 2 of the invention will now be described with reference to FIGS. 2A through 2D.

First, a positive chemically amplified resist material having the following composition is prepared:

| | |
|---|---|
| First base polymer: poly((norbornene-5-methylene hydroxyisopropyl carboxylate) (50 mol %) - (maleic anhydride) (50 mol %)) | 2 g |
| Second base polymer: poly((norbornene-5-methylene methoxymethyl carboxylate) (50 mol %) - (maleic anhydride) (50 mol %)) | 0.08 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Figure 2A:
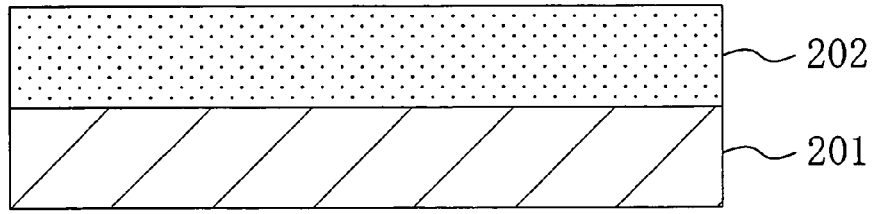
FIGS. 2A, 2B, 2C and 2D are cross-sectional views for showing procedures in a pattern formation method according to Embodiment 2 of the invention.

Next, as shown in FIG. 2A, the aforementioned chemically amplified resist material is applied on a substrate 201 so as to form a resist film 202 with a thickness of 0.35 μm.

Figure 2B:
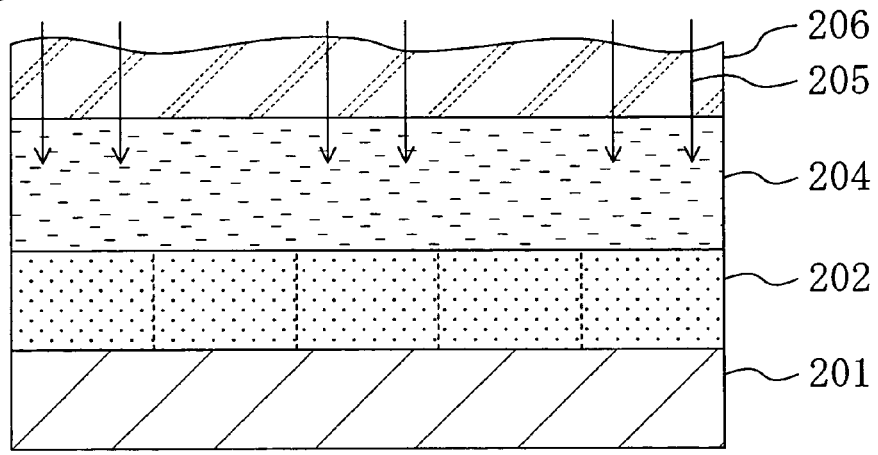

Then, as shown in FIG. 2B, with an immersion liquid 204 of water provided between the resist film 202 and a projection lens 206 by, for example, the puddle method, pattern exposure is carried out by irradiating the resist film 202 through the liquid 204 with exposing light 205 of ArF excimer laser with NA of 0.68 having passed through a mask (not shown).

Figure 2C:
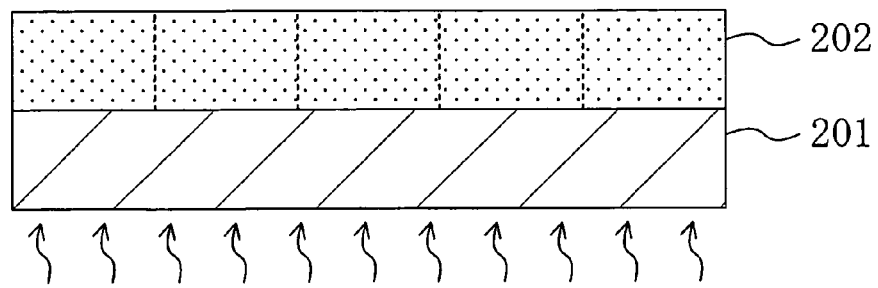

After the pattern exposure, as shown in FIG. 2C, the resist film 202 is baked with a hot plate at a temperature of 105° C. for 60 seconds (post exposure bake).

Figure 2D:
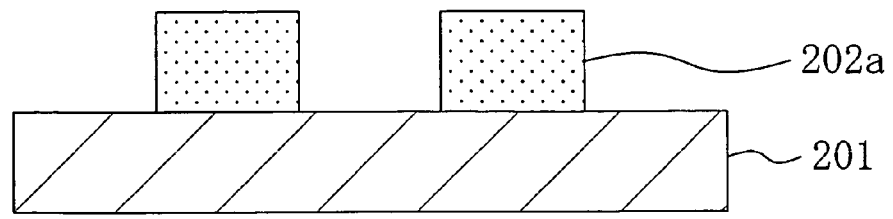

Next, the resultant resist film 202 is developed with a 2.38 wt % tetramethylammonium hydroxide developer. Thus, a resist pattern 202a made of an unexposed portion of the resist film 202 and having a line width of 0.09 μm is formed in a good shape free from a surface insoluble layer as shown in FIG. 2D.

In this manner, according to Embodiment 2, the chemically amplified resist material used for forming the resist film 202 includes the first polymer having hydroxyisopropyl carboxylate, that is, hemiketal. Since the hemiketal has a substituent for producing an OH group as described above, the number of OH groups with high reactivity with the alkaline developer is increased in an exposed portion of the resist film 202. As a result, even when a portion of the resist film 202 disposed in the vicinity of the interface with the liquid 204 is modified through the contact with the liquid 204, the lowering of the solubility of the exposed portion of the resist film 202 is compensated.

In addition, the chemically amplified resist material of Embodiment 2 includes approximately 4 mol % of methoxymethyl carboxylate, that is, acetal, as the second base polymer. Since the acetal has low activation energy for the elimination reaction by an acid, the contrast between the exposed portion and the unexposed portion of the resist film 202 is further improved, so that the resist pattern 202a can be formed in a further better shape.

Although the chemically amplified resist material of Embodiment 2 includes the second base polymer having acetal, the same effect can be attained when the first base polymer itself includes acetal or ketal.

Embodiment 3

A pattern formation method according to Embodiment 3 of the invention will now be described with reference to FIGS. 3A through 3D, 4A and 4B.

First, a positive chemically amplified resist material having the following composition is prepared:

| | |
|---|---|
| Base polymer: poly((norbornene-5-methylene hydroxyethyl carboxylate) (50 mol %) - (maleic anhydride) (50 mol %)) | 2 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Figure 3A:
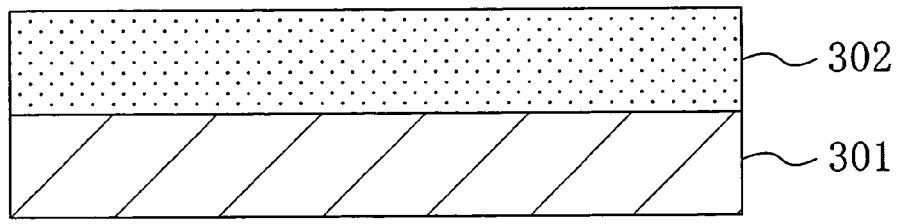
FIGS. 3A, 3B, 3C and 3D are cross-sectional views for showing procedures in a pattern formation method according to Embodiment 3 of the invention.

Next, as shown in FIG. 3A, the aforementioned chemically amplified resist material is applied on a substrate 301 so as to form a resist film 302 with a thickness of 0.35 μm.

Figure 3B:
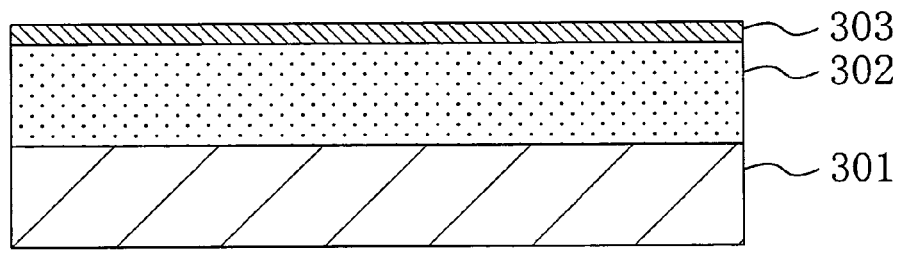

Then, as shown in FIG. 3B, by using a barrier film material having the following composition, a barrier film 303 having a thickness of 0.03 μm is formed on the resist film 302 by, for example, spin coating:

| | |
|---|---|
| Base polymer: polyvinyl hexafluoroisopropyl alcohol | 1 g |
| Solvent: t-butyl alcohol | 20 g |

Figure 3C:
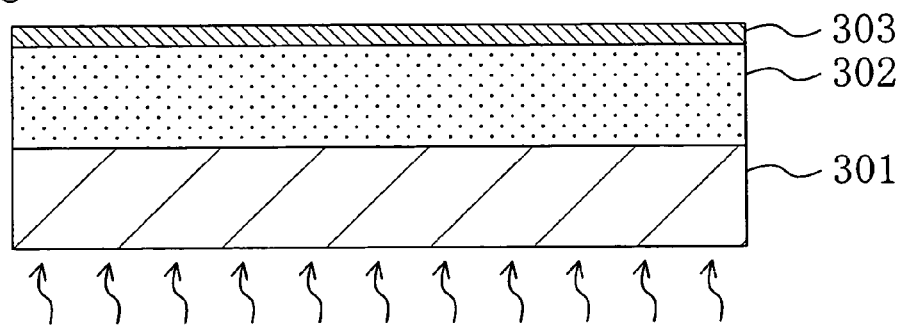

Next, as shown in FIG. 3C, the barrier film 303 thus formed is baked with a hot plate at a temperature of 120° C. for 90 seconds, so as to improve the denseness of the barrier film 303.

Figure 3D:
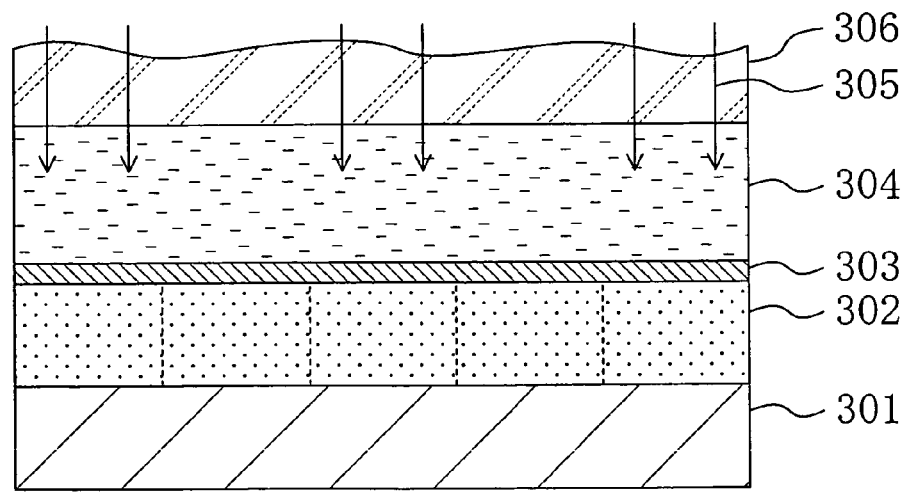

Next, as shown in FIG. 3D, with an immersion liquid 304 of water provided between the baked barrier film 303 and a projection lens 306 by, for example, the puddle method, pattern exposure is carried out by irradiating the resist film 302 through the liquid 304 and the barrier film 303 with exposing light 305 of ArF excimer laser with NA of 0.68 having passed through a mask (not shown).

Figure 4A:
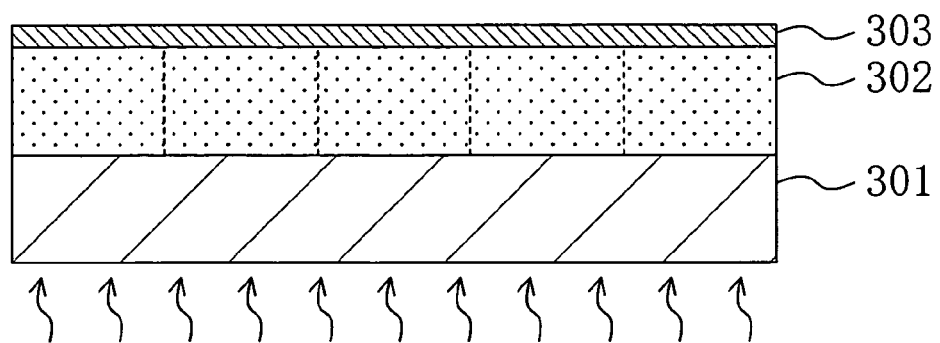
FIGS. 4A and 4B are cross-sectional views for showing other procedures in the pattern formation method of Embodiment 3.

After the pattern exposure, as shown in FIG. 4A, the resist film 302 is baked with a hot plate at a temperature of 105° C. for 60 seconds (post exposure bake).

Figure 4B:
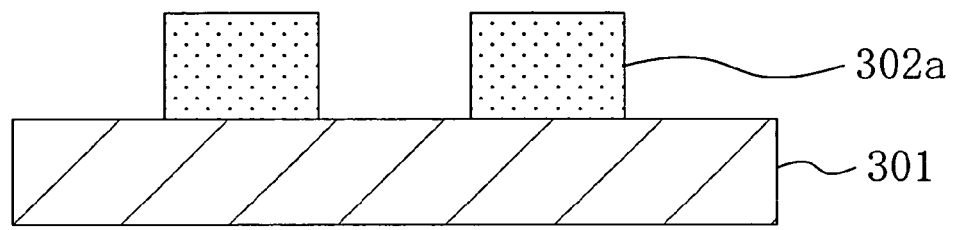

Next, the barrier film 303 is removed and the resultant resist film 302 is developed with a 2.38 wt % tetramethylammonium hydroxide developer. Thus, a resist pattern 302a made of an unexposed portion of the resist film 302 and having a line width of 0.09 μm is formed in a good shape free from a surface insoluble layer as shown in FIG. 4B.

In this manner, according to Embodiment 3, the chemically amplified resist material used for forming the resist film 302 includes the polymer having hydroxyethyl carboxylate, that is, hemiacetal. Since the hemiacetal has a substituent for producing an OH group, the number of OH groups with high reactivity with the alkaline developer is increased in an exposed portion of the resist film 302. As a result, even when a portion of the resist film 302 disposed in the vicinity of the interface with the barrier film 303 is modified through the contact with the barrier film 303, the lowering of the solubility of the exposed portion of the resist film 302 is compensated, so as to improve the contrast between the exposed portion and the unexposed portion of the resist film 302. Accordingly, the resist pattern 302a is formed in a good shape.

Embodiment 4

A pattern formation method according to Embodiment 4 of the invention will now be described with reference to FIGS. 5A through 5D, 6A and 6B.

First, a positive chemically amplified resist material having the following composition is prepared:

| | |
|---|---|
| First base polymer: poly((norbornene-5-methylene hydroxyethyl carboxylate) (50 mol %) - (maleic anhydride) (50 mol %)) | 2 g |
| Second base polymer: poly((norbornene-5-methylene methoxyisopropyl carboxylate) (50 mol %) - (maleic anhydride) (50 mol %)) | 0.1 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Figure 5A:
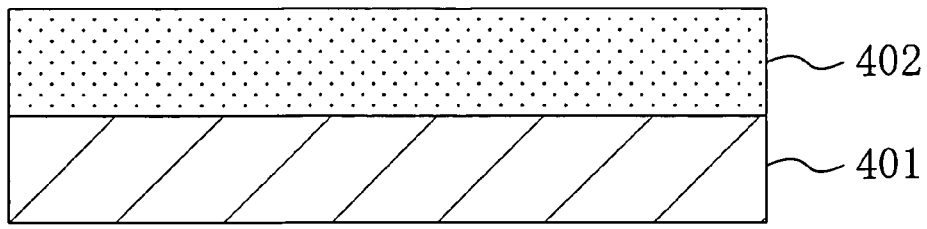
FIGS. 5A, 5B, 5C and 5D are cross-sectional views for showing procedures in a pattern formation method according to Embodiment 4 of the invention.

Next, as shown in FIG. 5A, the aforementioned chemically amplified resist material is applied on a substrate 401 so as to form a resist film 402 with a thickness of 0.35 μm.

Figure 5B:
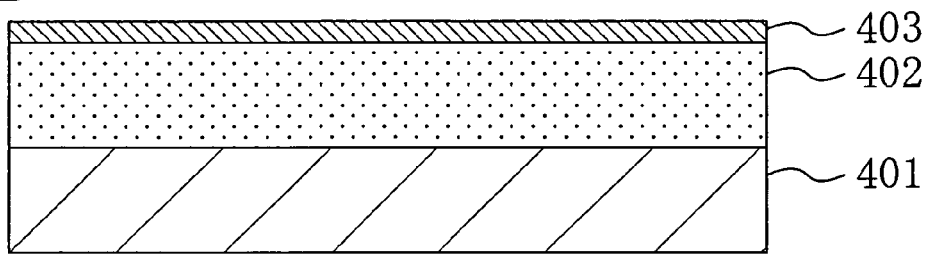

Then, as shown in FIG. 5B, by using a barrier film material having the following composition, a barrier film 403 having a thickness of 0.07 μm is formed on the resist film 402 by, for example, the spin coating:

| | |
|---|---|
| Base polymer: polyvinyl hexafluoroisopropyl alcohol | 1 g |
| Solvent: n-butyl alcohol | 20 g |

Figure 5C:
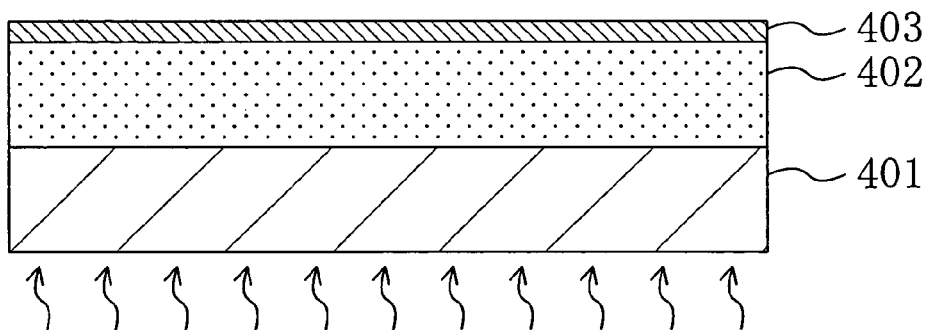

Next, as shown in FIG. 5C, the barrier film 403 thus formed is baked with a hot plate at a temperature of 120° C. for 90 seconds, so as to improve the denseness of the barrier film 403.

Figure 5D:
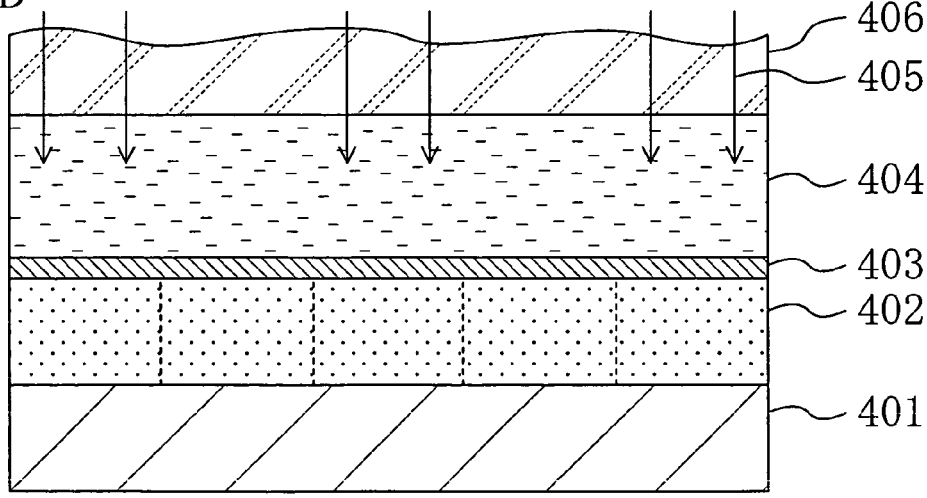

Next, as shown in FIG. 5D, with an immersion liquid 404 of water provided between the baked barrier film 403 and a projection lens 406 by, for example, the puddle method, pattern exposure is carried out by irradiating the resist film 402 through the liquid 404 and the barrier film 403 with exposing light 405 of ArF excimer laser with NA of 0.68 having passed through a mask (not shown).

Figure 6A:
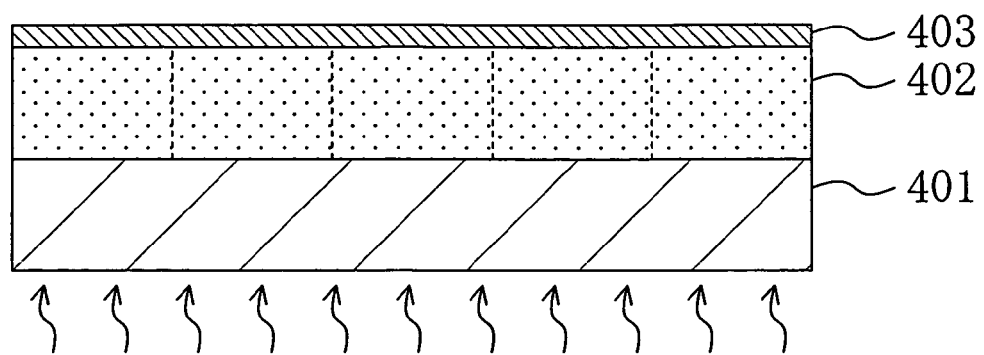
FIGS. 6A and 6B are cross-sectional views for showing other procedures in the pattern formation method of Embodiment 4.

After the pattern exposure, as shown in FIG. 6A, the resist film 402 is baked with a hot plate at a temperature of 105° C. for 60 seconds (post exposure bake).

Figure 6B:
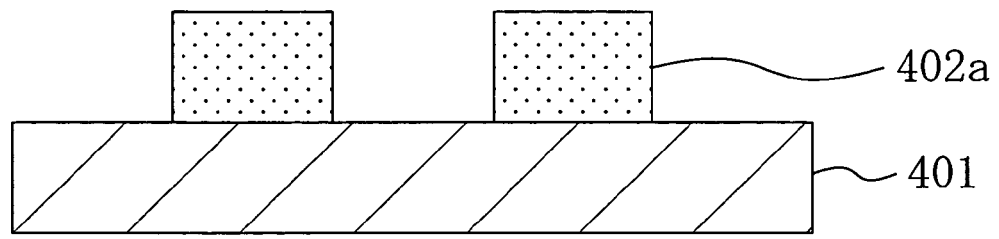

Next, the barrier film 403 is removed and the resultant resist film 402 is developed with a 2.38 wt % tetramethylammonium hydroxide developer. Thus, a resist pattern 402a made of an unexposed portion of the resist film 402 and having a line width of 0.09 µm is formed in a good shape free from a surface insoluble layer as shown in FIG. 6B.

In this manner, according to Embodiment 4, the chemically amplified resist material used for forming the resist film 402 includes the first polymer having hydroxyethyl carboxylate, that is, hemiacetal. Since the hemiacetal has a substituent for producing an OH group, the number of OH groups with high reactivity with the alkaline developer is increased in an exposed portion of the resist film 402. As a result, even when a portion of the resist film 402 disposed in the vicinity of the interface with the barrier film 403 is modified through the contact with the barrier film 403, the lowering of the solubility of the exposed portion of the resist film 402 is compensated.

In addition, the chemically amplified resist material of Embodiment 4 includes approximately 5 mol % of methoxyisopropyl carboxylate, that is, ketal, as the second base polymer. Since the ketal has low activation energy for the elimination reaction by an acid, the contrast between the exposed portion and the unexposed portion of the resist film 402 is further improved, so that the resist pattern 402a can be formed in a further better shape.

Although the chemically amplified resist material of Embodiment 4 includes the second base polymer having ketal, the same effect can be attained when the first base polymer itself includes acetal or ketal.

Embodiment 5

A pattern formation method according to Embodiment 5 of the invention will now be described with reference to FIGS. 7A through 7D and 8A through 8C.

First, a positive chemically amplified resist material having the following composition is prepared:

| | |
|---|---|
| Base polymer: poly((norbornene-5-methylene hydroxyisopropyl carboxylate) (50 mol %) - (maleic anhydride) (50 mol %)) | 2 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Figure 7A:
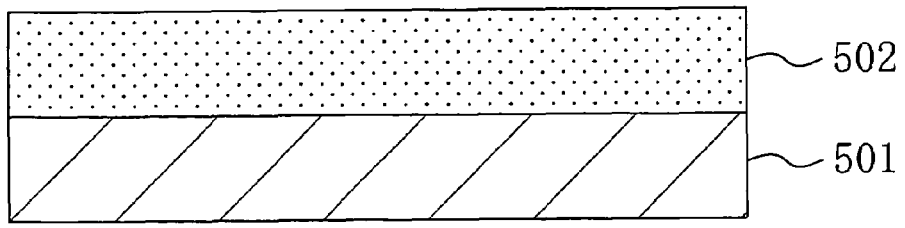
FIGS. 7A, 7B, 7C and 7D are cross-sectional views for showing procedures in a pattern formation method according to Embodiment 5 of the invention.

Next, as shown in FIG. 7A, the aforementioned chemically amplified resist material is applied on a substrate 501 so as to form a resist film 502 with a thickness of 0.35 µm.

Figure 7B:
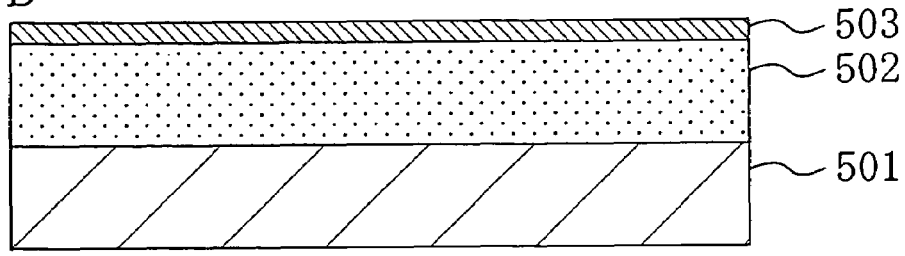

Then, as shown in FIG. 7B, by using a barrier film material having the following composition, a barrier film 503 having a thickness of 0.03 µm is formed on the resist film 502 by, for example, the spin coating:

| | |
|---|---|
| Base polymer: polyvinyl hexafluoroisopropyl alcohol | 1 g |
| Solvent: t-butyl alcohol | 20 g |

Figure 7C:
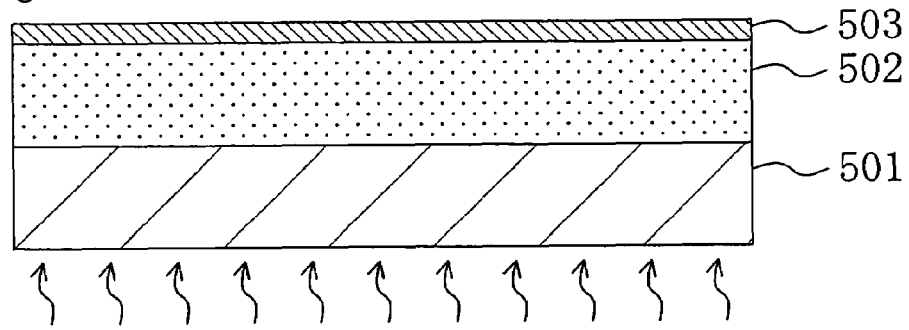

Next, as shown in FIG. 7C, the barrier film 503 thus formed is baked with a hot plate at a temperature of 110° C. for 90 seconds, so as to improve the denseness of the barrier film 503.

Figure 7D:
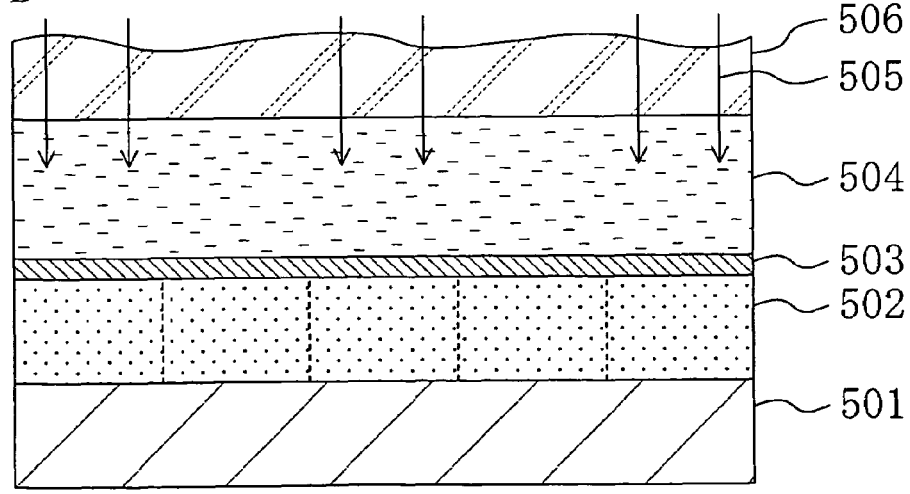

Next, as shown in FIG. 7D, with an immersion liquid 504 of water provided between the baked barrier film 503 and a projection lens 506 by, for example, the puddle method, pattern exposure is carried out by irradiating the resist film 502 through the liquid 504 and the barrier film 503 with exposing light 505 of ArF excimer laser with NA of 0.68 having passed through a mask (not shown).

Figure 8A:
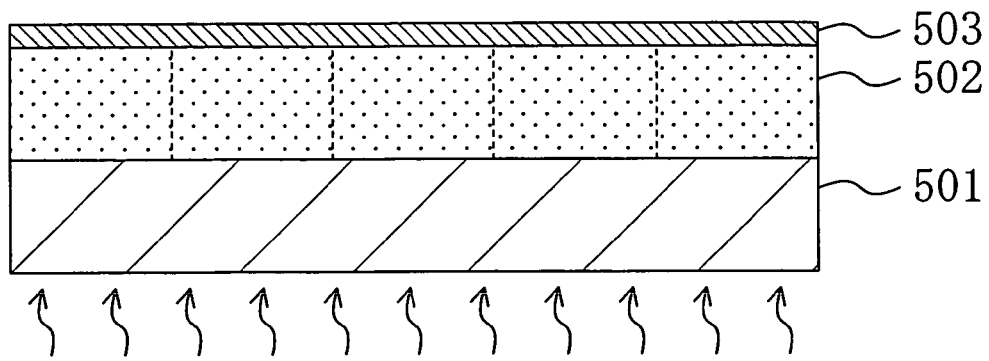
FIGS. 8A, 8B and 8C are cross-sectional views for showing other procedures in the pattern formation method of Embodiment 5.

After the pattern exposure, as shown in FIG. 8A, the resist film 502 is baked with a hot plate at a temperature of 105° C. for 60 seconds (post exposure bake).

Figure 8B:
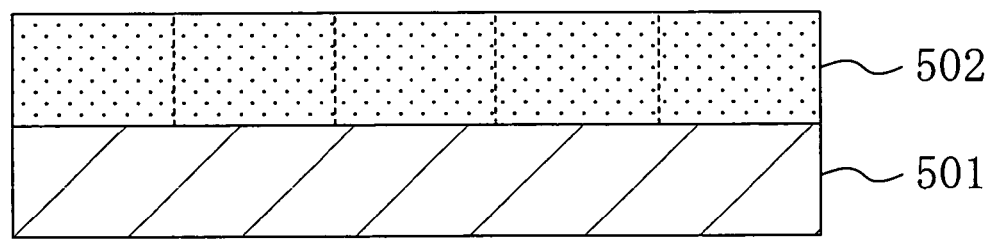
Figure 8C:
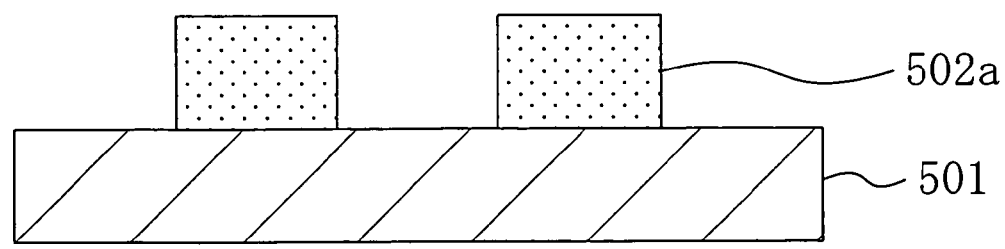

Next, after removing the barrier film 503 with, for example, a 0.005 wt % tetramethylammonium hydroxide aqueous solution (diluted alkaline developer) as shown in FIG. 8B, the resultant resist film 502 is developed with a 2.38 wt % tetramethylammonium hydroxide developer. Thus, a resist pattern 502a made of an unexposed portion of the resist film 502 and having a line width of 0.09 µm is formed in a good shape free from a surface insoluble layer as shown in FIG. 8C.

In this manner, according to Embodiment 5, the chemically amplified resist material used for forming the resist film 502 includes the polymer having hydroxyisopropyl carboxylate, that is, hemiketal. Since the hemiketal has a substituent for producing an OH group, the number of OH groups with high reactivity with the alkaline developer is increased in an exposed portion of the resist film 502. As a result, even when a portion of the resist film 502 disposed in the vicinity of the interface with the barrier film 503 is modified through the contact with the barrier film 503, the lowering of the solubility of the exposed portion of the resist film 502 is compensated, so as to improve the contrast between the exposed portion and the unexposed portion of the resist film 502. Accordingly, the resist pattern 502a is formed in a good shape.

Embodiment 6

A pattern formation method according to Embodiment 6 of the invention will now be described with reference to FIGS. 9A through 9D and 10A through 10C.

First, a positive chemically amplified resist material having the following composition is prepared:

| | |
|---|---|
| First base polymer: poly((norbornene-5-methylene hydroxymethyl carboxylate) (50 mol %) - (maleic anhydride) (50 mol %)) | 2 g |
| Second base polymer: poly((norbornene-5-methylene ethoxymethyl carboxylate) (50 mol %) - (maleic anhydride) (50 mol %)) | 0.01 g |
| Acid generator: triphenylsulfonium trifluoromethane sulfonate | 0.04 g |
| Quencher: triethanolamine | 0.002 g |
| Solvent: propylene glycol monomethyl ether acetate | 20 g |

Figure 9A:
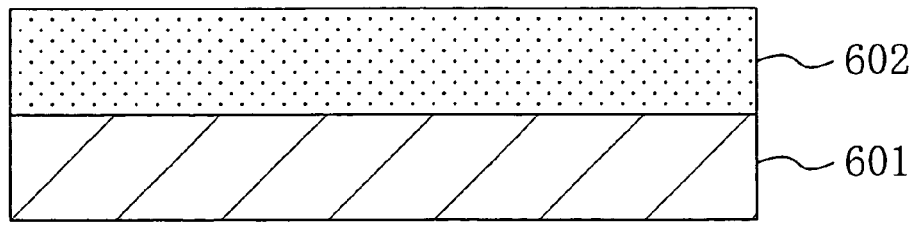
FIGS. 9A, 9B, 9C and 9D are cross-sectional views for showing procedures in a pattern formation method according to Embodiment 6 of the invention.

Next, as shown in FIG. 9A, the aforementioned chemically amplified resist material is applied on a substrate 601 so as to form a resist film 602 with a thickness of 0.35 µm.

Figure 9B:
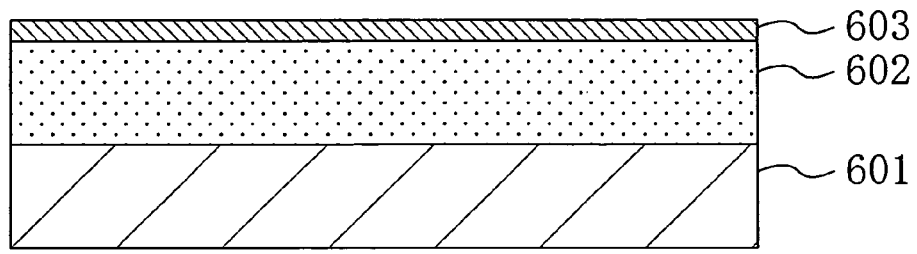

Then, as shown in FIG. 9B, by using a barrier film material having the following composition, a barrier film 603 having a thickness of 0.07 µm is formed on the resist film 602 by, for example, the spin coating:

| | |
|---|---|
| Base polymer: polyvinyl hexafluoroisopropyl alcohol | 1 g |
| Solvent: n-butyl alcohol | 20 g |

Figure 9C:
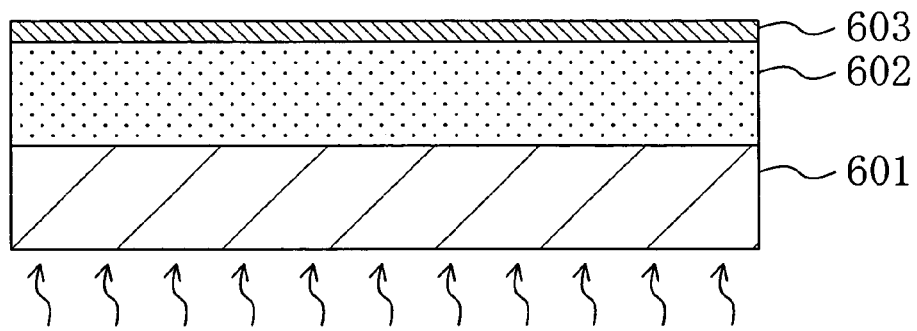

Next, as shown in FIG. 9C, the barrier film 603 thus formed is baked with a hot plate at a temperature of 110° C. for 90 seconds, so as to improve the denseness of the barrier film 603.

Figure 9D:
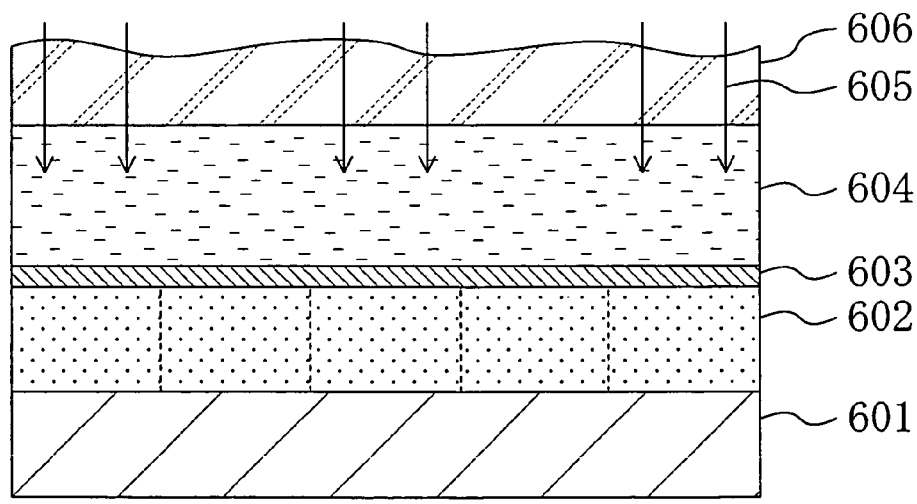

Next, as shown in FIG. 9D, with an immersion liquid 604 of a 5 wt % cesium sulfate ($Cs_2SO_4$) aqueous solution provided between the baked barrier film 603 and a projection lens 606 by, for example, the puddle method, pattern exposure is carried out by irradiating the resist film 602 through the liquid 604 and the barrier film 603 with exposing light 605 of ArF excimer laser with NA of 0.68 having passed through a mask (not shown).

Figure 10A:
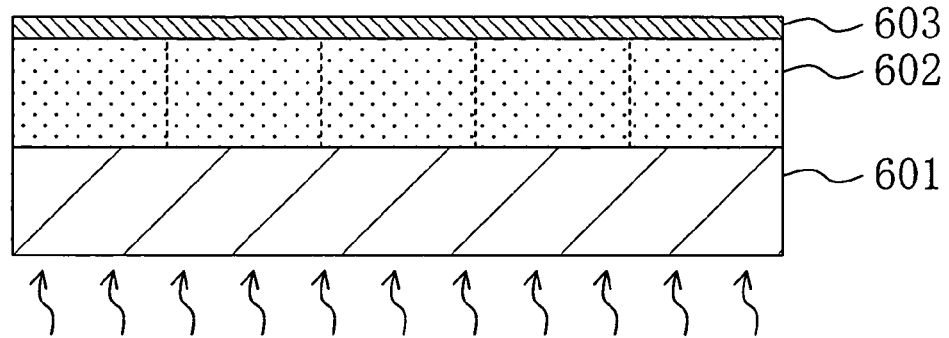
FIGS. 10A, 10B and 10C are cross-sectional views for showing other procedures in the pattern formation method of Embodiment 6.
Figure 10B:
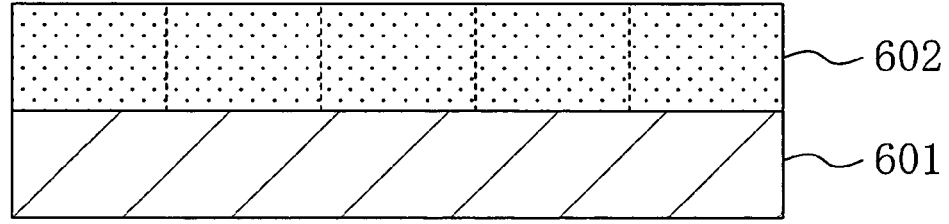

After the pattern exposure, as shown in FIG. 10A, the resist film 602 is baked with a hot plate at a temperature of 105° C. for 60 seconds (post exposure bake).

Figure 10C:
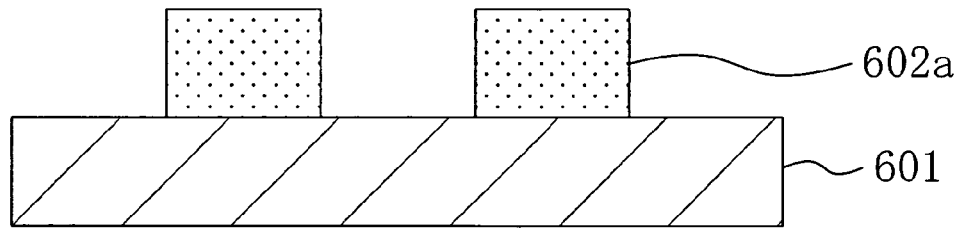
Figure 11A:
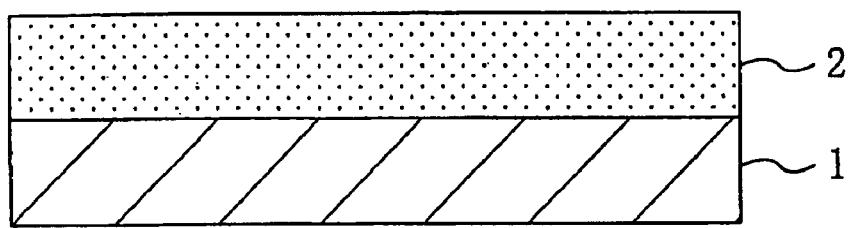
FIGS. 11A, 11B, 11C and 11D are cross-sectional views for showing procedures in a pattern formation method according to Conventional Example 1.
Figure 11B:
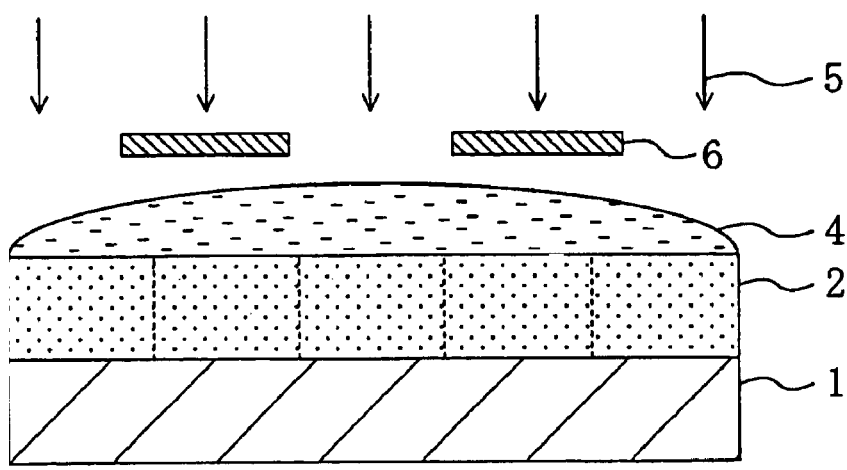
Figure 11C:
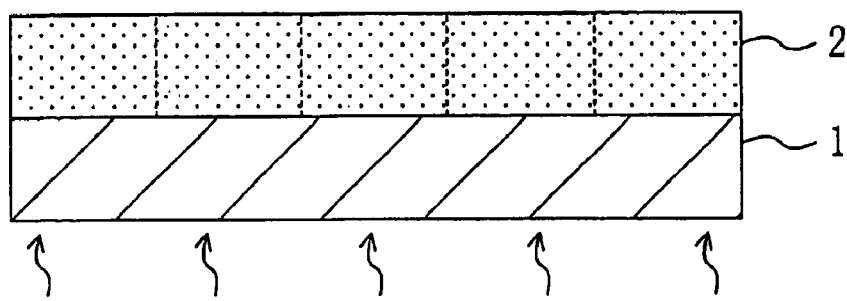
Figure 11D:
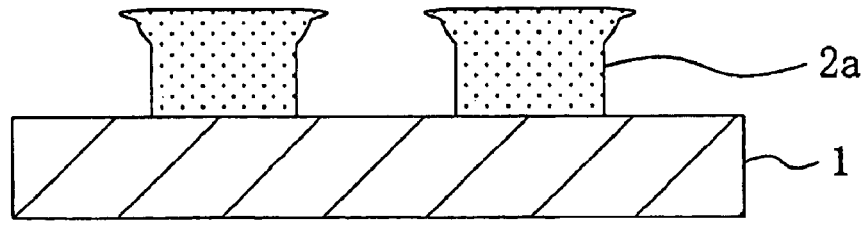
Figure 12A:
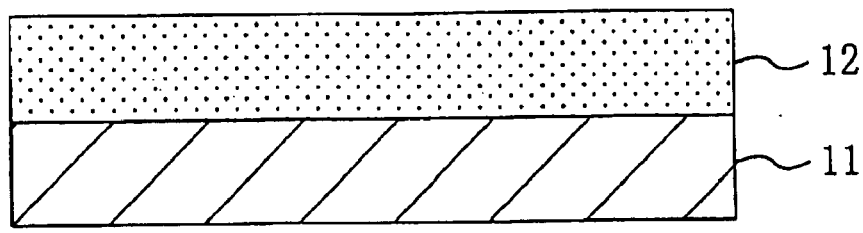
FIGS. 12A, 12B, 12C and 12D are cross-sectional views for showing procedures in a pattern formation method according to Conventional Example 2.
Figure 12B:
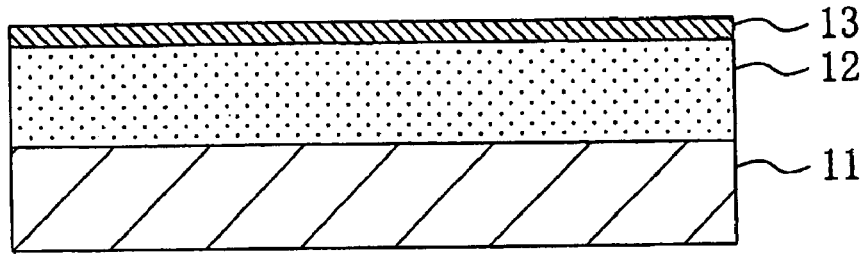
Figure 12C:
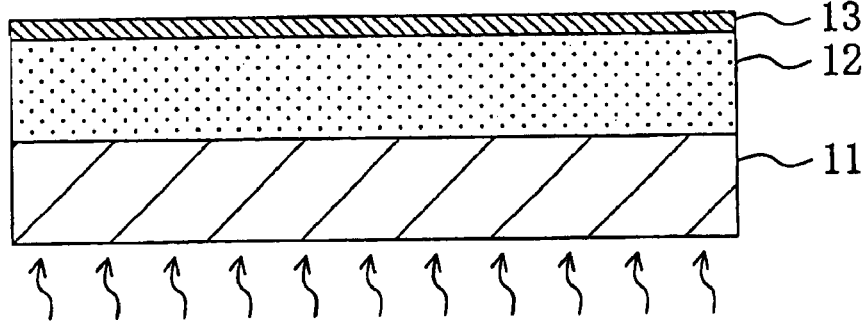
Figure 12D:
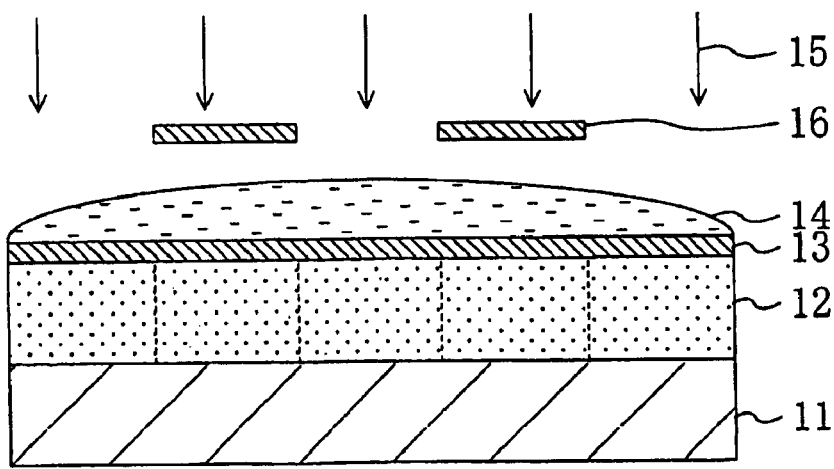
Figure 13A:
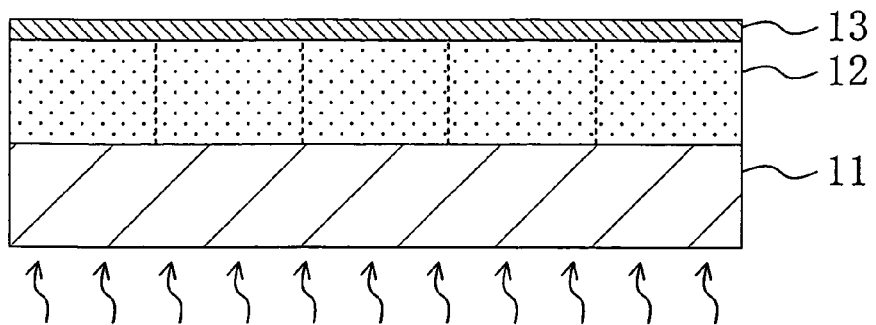
FIGS. 13A and 13B are cross-sectional views for showing other procedures in the pattern formation method of Conventional Example 2.
Figure 13B:
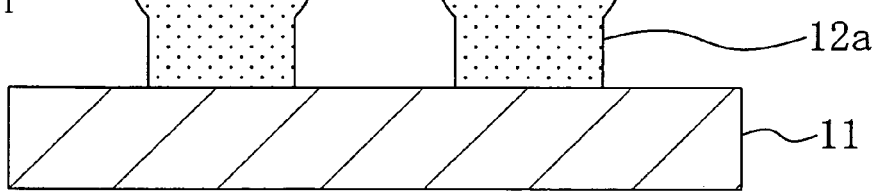
Figure 14:
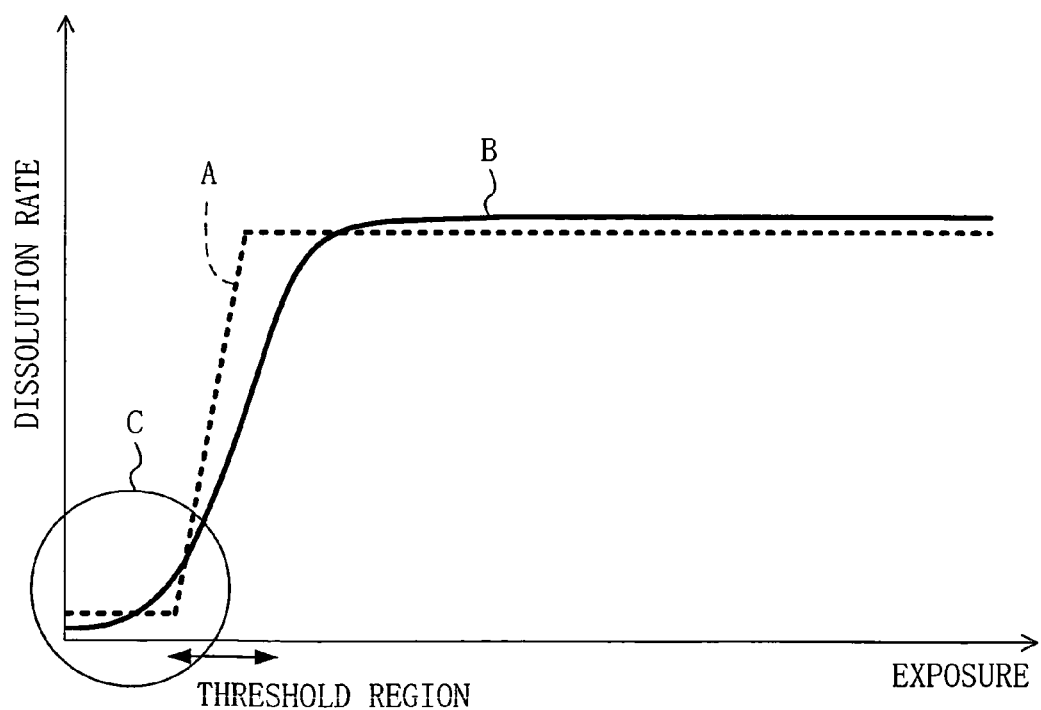
FIG. 14 is a graph for explaining control of solubility of a resist in the pattern formation method of this invention.

Next, after removing the barrier film 603 with, for example, a 0.005 wt % tetramethylammonium hydroxide aqueous solution (diluted alkaline developer), the resultant resist film 602 is developed with a 2.38 wt % tetramethylammonium hydroxide developer. Thus, a resist pattern 602a made of an unexposed portion of the resist film 602 and having a line width of 0.09 μm is formed in a good shape free from a surface insoluble layer as shown in FIG. 10C.

In this manner, according to Embodiment 6, the chemically amplified resist material used for forming the resist film 602 includes the first polymer having hydroxymethyl carboxylate, that is, hemiacetal. Since the hemiacetal has a substituent for producing an OH group, the number of OH groups with high reactivity with the alkaline developer is increased in an exposed portion of the resist film 602. As a result, even when a portion of the resist film 602 disposed in the vicinity of the interface with the barrier film 603 is modified through the contact with the barrier film 603, the lowering of the solubility of the exposed portion of the resist film 602 is compensated.

In addition, the chemically amplified resist material of Embodiment 6 includes approximately 0.05 mol % of ethoxymethyl carboxylate, that is, acetal, as the second base polymer. Since the acetal has low activation energy for the elimination reaction by an acid, the contrast between the exposed portion and the unexposed portion of the resist film 602 is further improved, so that the resist pattern 602a can be formed in a further better shape.

Although the chemically amplified resist material of Embodiment 6 includes the second base polymer having acetal, the same effect can be attained when the first base polymer itself includes acetal or ketal.

In each of Embodiments 3 through 6, the thickness of the barrier film is set to approximately 0.03 μm through 0.07 μm. However, the thickness is not limited to this range but the lower limit of the thickness of the barrier film is a thickness capable of preventing a component of the resist film from eluting into the liquid or preventing the liquid from permeating into the resist film, and the upper limit of the thickness is a thickness that does not prevent transmission of the exposing light and can be easily removed.

Furthermore, although the barrier film is baked for increasing the denseness thereof in each of Embodiments 3 through 6, the bake of the barrier film is not always necessary and can be performed appropriately depending upon the composition, the thickness and the like of the barrier film.

Also in each of Embodiments 1 through 5, cesium sulfate may be added to the immersion liquid in the same manner as in Embodiment 6 so as to increase the refractive index of the liquid. The compound to be added to the liquid is not limited to cesium sulfate but may be phosphoric acid ($H_3PO_4$). Furthermore, a surface active agent may be added to the liquid.

Although the exposing light is ArF excimer laser in each of Embodiments 1 through 6, the exposing light is not limited to it but may be KrF excimer laser, $Xe_2$ laser, $F_2$ laser, KrAr laser or $Ar_2$ laser instead.

Furthermore, the puddle method is employed for providing the liquid onto the resist film or the barrier film in each embodiment, which does not limit the invention, and for example, a dip method in which the whole substrate is dipped in the liquid may be employed instead.

Moreover, although a positive chemically amplified resist is used for forming the resist film in each embodiment, the present invention is applicable also to a negative chemically amplified resist.

As described so far, according to the chemically amplified resist material and the pattern formation method using the same of this invention, lowering of solubility derived from modification of a resist film caused by an immersion liquid or a barrier film is prevented, so as to form a fine pattern in a good shape. Accordingly, the invention is useful for fine pattern formation or the like employed in fabrication process for semiconductor devices.

What is claimed is:

1. A chemically amplified resist material for use in immersion lithography comprising:
   a polymer having hemiacetal and acetal.
2. A chemically amplified resist material for use in immersion lithography comprising:
   a polymer having hemiacetal and ketal.
3. A chemically amplified resist material for use in immersion lithography comprising:
   a polymer having hemiketal and acetal.
4. A chemically amplified resist material for use in immersion lithography comprising:
   a polymer having hemiketal and ketal.
5. A chemically amplified resist material for use in immersion lithography comprising:
   a first polymer having hemiacetal and a second polymer having acetal.
6. A chemically amplified resist material for use in immersion lithography comprising:
   a first polymer having hemiacetal and a second polymer having ketal.
7. A chemically amplified resist material for use in immersion lithography comprising:
   a first polymer having hemiketal and a second polymer having acetal.
8. A chemically amplified resist material for use in immersion lithography comprising:
   a first polymer having hemiketal and a second polymer having ketal.
9. The chemically amplified resist material of claim 1, 3, 5, or 7,
   wherein said acetal is methoxymethyl carboxylate, ethoxymethyl carboxylate, methoxyethyl carboxylate, ethoxyethyl carboxylate, adamantoxymethyl carboxylate or adamantoxyethyl carboxylate.

10. The chemically amplified resist material of claim 2, 4, 6, or 8,
wherein said ketal is methoxyisopropyl carboxylate, ethoxyisopropyl carboxylate or adamantoxyisopropyl carboxylate.

11. The chemically amplified resist material of claim 1, 2, 5 or 6,
wherein said hemiacetal is hydroxymethyl carboxylate or hydroxyethyl carboxylate.

12. The chemically amplified resist material of claim 3, 4, 7 or 8,
wherein said hemiketal is hydroxyisopropyl carboxylate.

13. A pattern formation method comprising the steps of:
forming, on a substrate, a resist film made of a chemically amplified resist material including a polymer having hemiacetal and acetal;
performing pattern exposure by selectively irradiating said resist film with exposing light with a liquid provided on said resist film; and
forming a resist pattern made of said resist film by developing said resist film after the pattern exposure.

14. A pattern formation method comprising the steps of:
forming, on a substrate, a resist film made of a chemically amplified resist material including a polymer having hemiacetal and ketal;
performing pattern exposure by selectively irradiating said resist film with exposing light with a liquid provided on said resist film; and
forming a resist pattern made of said resist film by developing said resist film after the pattern exposure.

15. A pattern formation method comprising the steps of:
forming, on a substrate, a resist film made of a chemically amplified resist material including a polymer having hemiketal and acetal;
performing pattern exposure by selectively irradiating said resist film with exposing light with a liquid provided on said resist film; and
forming a resist pattern made of said resist film by developing said resist film after the pattern exposure.

16. A pattern formation method comprising the steps of:
forming, on a substrate, a resist film made of a chemically amplified resist material including a polymer having hemiketal and ketal;
performing pattern exposure by selectively irradiating said resist film with exposing light with a liquid provided on said resist film; and
forming a resist pattern made of said resist film by developing said resist film after the pattern exposure.

17. A pattern formation method comprising the steps of:
forming, on a substrate, a resist film made of a chemically amplified resist material including a first polymer having hemiacetal and a second polymer having acetal;
performing pattern exposure by selectively irradiating said resist film with exposing light with a liquid provided on said resist film; and
forming a resist pattern made of said resist film by developing said resist film after the pattern exposure.

18. A pattern formation method comprising the steps of:
forming, on a substrate, a resist film made of a chemically amplified resist material including a first polymer having hemiacetal and a second polymer having ketal;
performing pattern exposure by selectively irradiating said resist film with exposing light with a liquid provided on said resist film; and
forming a resist pattern made of said resist film by developing said resist film after the pattern exposure.

19. A pattern formation method comprising the steps of:
forming, on a substrate, a resist film made of a chemically amplified resist material including a first polymer having hemiketal and a second polymer having acetal;
performing pattern exposure by selectively irradiating said resist film with exposing light with a liquid provided on said resist film; and
forming a resist pattern made of said resist film by developing said resist film after the pattern exposure.

20. A pattern formation method comprising the steps of:
forming, on a substrate, a resist film made of a chemically amplified resist material including a first polymer having hemiketal and a second polymer having ketal;
performing pattern exposure by selectively irradiating said resist film with exposing light with a liquid provided on said resist film; and
forming a resist pattern made of said resist film by developing said resist film after the pattern exposure.

21. A pattern formation method comprising the steps of:
forming, on a substrate, a resist film made of a chemically amplified resist material including a polymer having hemiacetal and acetal;
forming a barrier film on said resist film;
performing pattern exposure by selectively irradiating said resist film through said barrier film with exposing light with a liquid provided on said barrier film; and
removing said barrier film and forming a resist pattern made of said resist film by developing said resist film after the pattern exposure.

22. A pattern formation method comprising the steps of:
forming, on a substrate, a resist film made of a chemically amplified resist material including a polymer having hemiacetal and ketal;
forming a barrier film on said resist film;
performing pattern exposure by selectively irradiating said resist film through said barrier film with exposing light with a liquid provided on said barrier film; and
removing said barrier film and forming a resist pattern made of said resist film by developing said resist film after the pattern exposure.

23. A pattern formation method comprising the steps of:
forming, on a substrate, a resist film made of a chemically amplified resist material including a polymer having hemiketal and acetal;
forming a barrier film on said resist film;
performing pattern exposure by selectively irradiating said resist film through said barrier film with exposing light with a liquid provided on said barrier film; and
removing said barrier film and forming a resist pattern made of said resist film by developing said resist film after the pattern exposure.

24. A pattern formation method comprising the steps of:
forming, on a substrate, a resist film made of a chemically amplified resist material including a polymer having hemiketal and ketal;
forming a barrier film on said resist film;
performing pattern exposure by selectively irradiating said resist film through said barrier film with exposing light with a liquid provided on said barrier film; and
removing said barrier film and forming a resist pattern made of said resist film by developing said resist film after the pattern exposure.

25. A pattern formation method comprising the steps of:
forming, on a substrate, a resist film made of a chemically amplified resist material including a first polymer having hemiacetal and a second polymer having acetal;
forming a barrier film on said resist film;

performing pattern exposure by selectively irradiating said resist film through said barrier film with exposing light with a liquid provided on said barrier film; and removing said barrier film and forming a resist pattern made of said resist film by developing said resist film after the pattern exposure.

26. A pattern formation method comprising the steps of:

forming, on a substrate, a resist film made of a chemically amplified resist material including a first polymer having hemiacetal and a second polymer having ketal;

forming a barrier film on said resist film;

performing pattern exposure by selectively irradiating said resist film through said barrier film with exposing light with a liquid provided on said barrier film; and removing said barrier film and forming a resist pattern made of said resist film by developing said resist film after the pattern exposure.

27. A pattern formation method comprising the steps of:

forming, on a substrate, a resist film made of a chemically amplified resist material including a first polymer having hemiketal and a second polymer having acetal;

forming a barrier film on said resist film;

performing pattern exposure by selectively irradiating said resist film through said barrier film with exposing light with a liquid provided on said barrier film; and removing said barrier film and forming a resist pattern made of said resist film by developing said resist film after the pattern exposure.

28. A pattern formation method comprising the steps of:

forming, on a substrate, a resist film made of a chemically amplified resist material including a first polymer having hemiketal and a second polymer having ketal;

forming a barrier film on said resist film;

performing pattern exposure by selectively irradiating said resist film through said barrier film with exposing light with a liquid provided on said barrier film; and removing said barrier film and forming a resist pattern made of said resist film by developing said resist film after the pattern exposure.

29. A pattern formation method comprising the steps of:

forming, on a substrate, a resist film made of a chemically amplified resist material including a polymer having hemiacetal and acetal;

forming a barrier film on said resist film;

performing pattern exposure by selectively irradiating said resist film through said barrier film with exposing light with a liquid provided on said barrier film;

removing said barrier film; and forming a resist pattern made of said resist film by developing said resist film having been subjected to the pattern exposure after removing said barrier film.

30. A pattern formation method comprising the steps of:

forming, on a substrate, a resist film made of a chemically amplified resist material including a polymer having hemiacetal and ketal;

forming a barrier film on said resist film;

performing pattern exposure by selectively irradiating said resist film through said barrier film with exposing light with a liquid provided on said barrier film;

removing said barrier film; and forming a resist pattern made of said resist film by developing said resist film having been subjected to the pattern exposure after removing said barrier film.

31. A pattern formation method comprising the steps of:

forming, on a substrate, a resist film made of a chemically amplified resist material including a polymer having hemiketal and acetal;

forming a barrier film on said resist film;

performing pattern exposure by selectively irradiating said resist film through said barrier film with exposing light with a liquid provided on said barrier film;

removing said barrier film; and forming a resist pattern made of said resist film by developing said resist film having been subjected to the pattern exposure after removing said barrier film.

32. A pattern formation method comprising the steps of:

forming, on a substrate, a resist film made of a chemically amplified resist material including a polymer having hemiketal and ketal;

forming a barrier film on said resist film;

performing pattern exposure by selectively irradiating said resist film through said barrier film with exposing light with a liquid provided on said barrier film;

removing said barrier film; and forming a resist pattern made of said resist film by developing said resist film having been subjected to the pattern exposure after removing said barrier film.

33. A pattern formation method comprising the steps of:

forming, on a substrate, a resist film made of a chemically amplified resist material including a first polymer having hemiacetal and a second polymer having acetal;

forming a barrier film on said resist film;

performing pattern exposure by selectively irradiating said resist film through said barrier film with exposing light with a liquid provided on said barrier film;

removing said barrier film; and forming a resist pattern made of said resist film by developing said resist film having been subjected to the pattern exposure after removing said barrier film.

34. A pattern formation method comprising the steps of:

forming, on a substrate, a resist film made of a chemically amplified resist material including a first polymer having hemiacetal and a second polymer having ketal;

forming a barrier film on said resist film;

performing pattern exposure by selectively irradiating said resist film through said barrier film with exposing light with a liquid provided on said barrier film;

removing said barrier film; and forming a resist pattern made of said resist film by developing said resist film having been subjected to the pattern exposure after removing said barrier film.

35. A pattern formation method comprising the steps of:

forming, on a substrate, a resist film made of a chemically amplified resist material including a first polymer having hemiketal and a second polymer having acetal;

forming a barrier film on said resist film;

performing pattern exposure by selectively irradiating said resist film through said barrier film with exposing light with a liquid provided on said barrier film;

removing said barrier film; and forming a resist pattern made of said resist film by developing said resist film having been subjected to the pattern exposure after removing said barrier film.

36. A pattern formation method comprising the steps of:

forming, on a substrate, a resist film made of a chemically amplified resist material including a first polymer having hemiketal and a second polymer having ketal;

forming a barrier film on said resist film;

performing pattern exposure by selectively irradiating said resist film through said barrier film with exposing light with a liquid provided on said barrier film;

removing said barrier film; and forming a resist pattern made of said resist film by developing said resist film having been subjected to the pattern exposure after removing said barrier film.

37. The chemically amplified resist material of claim 13, 15, 17, 19, 21, 23, 25, 27, 29, 31, 33 or 35,
wherein said acetal is methoxymethyl carboxylate, ethoxymethyl carboxylate, methoxyethyl carboxylate, ethoxyethyl carboxylate, adamantoxymethyl carboxylate or adamantoxyethyl carboxylate.

38. The chemically amplified resist material of claim 14, 16, 18, 20, 22, 24, 26, 28, 30, 32, 34 or 36,
wherein said ketal is methoxyisopropyl carboxylate, ethoxyisopropyl carboxylate or adamantoxyisopropyl carboxylate.

39. The chemically amplified resist material of claim 13, 14, 17, 18, 21, 22, 25, 26, 29, 30, 33 or 34,
wherein said hemiacetal is hydroxymethyl carboxylate or hydroxyethyl carboxylate.

40. The chemically amplified resist material of claim 15, 16, 19, 20, 23, 24, 27, 28, 31, 32, 35 or 36,
wherein said hemiketal is hydroxyisopropyl carboxylate.

41. The pattern formation method of any one of claims 13-36,
wherein said liquid is water or an acidic solution.

42. The pattern formation method of claim 41,
wherein said acidic solution is a cesium sulfate aqueous solution or a phosphoric acid aqueous solution.

\* \* \* \* \*